US008268689B2

(12) United States Patent
Guo et al.

(10) Patent No.: US 8,268,689 B2
(45) Date of Patent: Sep. 18, 2012

(54) MULTIPLE THRESHOLD VOLTAGES IN FIELD EFFECT TRANSISTOR DEVICES

(75) Inventors: Dechao Guo, Wappingers Falls, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 12/860,979

(22) Filed: Aug. 23, 2010

(65) Prior Publication Data

US 2012/0043620 A1 Feb. 23, 2012

(51) Int. Cl.
*H01L 27/088* (2006.01)

(52) U.S. Cl. ........ 438/275; 438/276; 257/392; 257/402; 257/E21.633

(58) Field of Classification Search .................. 257/407; 438/276
See application file for complete search history.

(56) References Cited

U.S. PATENT DOCUMENTS

| | | | | |
|---|---|---|---|---|
| 6,787,406 B1 * | 9/2004 | Hill et al. | ....................... | 438/164 |
| 7,262,104 B1 * | 8/2007 | Wang et al. | ..................... | 438/289 |
| 7,488,656 B2 | 2/2009 | Cartier et al. | | |
| 7,696,036 B2 | 4/2010 | Bu et al. | | |
| 2003/0075766 A1 * | 4/2003 | Lin et al. | ....................... | 257/407 |
| 2004/0132239 A1 * | 7/2004 | Lin et al. | ....................... | 438/199 |
| 2005/0001273 A1 * | 1/2005 | Bryant et al. | .................. | 257/369 |
| 2006/0014338 A1 * | 1/2006 | Doris et al. | .................... | 438/197 |
| 2007/0040221 A1 * | 2/2007 | Gossner et al. | ................ | 257/355 |
| 2007/0096157 A1 * | 5/2007 | Nabatame et al. | ............ | 257/213 |
| 2009/0108294 A1 | 4/2009 | Choi et al. | | |
| 2009/0291553 A1 | 11/2009 | Doris et al. | | |
| 2010/0038641 A1 | 2/2010 | Imai | | |
| 2010/0051937 A1 | 3/2010 | Kaji et al. | | |

OTHER PUBLICATIONS

K. Akiyama et al., "Vfb Roll-off in HfO2 Gate Stack after High Temperature Annealing Process," 2007 Symposium on VLSI Technology Digest of Technical Papers, authorized licensed use limited to: KnowledgeGate from IBM Market Insights. Downloaded on Apr. 23, 2010 from IEEE Xplore, pp. 72-73.
M. S. Arnold et al., "Field-Effect Transistors Based on Single Semiconducting Oxide Nanobelts," J. Phys. Chem. B. 2003, 107, pp. 659-663, copyright 2003 American Chemical Society, published on Web Dec. 28, 2002.

(Continued)

*Primary Examiner* — Matthew W Such
*Assistant Examiner* — Abul Kalam
(74) *Attorney, Agent, or Firm* — Cantor Colburn LLP; Vazken Alexanian (57) ABSTRACT

A method for fabricating a field effect transistor device includes forming a first conducting channel and a second conducting channel, forming a first gate stack on the first conducting channel to partially define a first device, forming second gate stack on the second conducting channel to partially define a second device, implanting ions to form a source region and a drain region connected to the first conducting channel and the second conducting channel, forming a masking layer over second device, a portion of the source region and a portion of the drain region, performing a first annealing process operative to change a threshold voltage of the first device, removing a portion of the masking layer to expose the second device, and performing a second annealing process operative to change the threshold voltage of the first device and a threshold voltage of the second device.

16 Claims, 10 Drawing Sheets

OTHER PUBLICATIONS

E. Cartier et al., "pFET Vt Control with JfO2/TiN/poly-Si Gate Stack Using a Lateral Oxygenation Process," 2009 Symposium on VLSI Technology Digest of Technical Papers, authorized licensed use limited to: KnowledgeGate from IBM Market Insights. Downloaded on Apr. 23, 2010 from IEEE Xplore, pp. 42-43.

E. Cartier et al., "Role of Oxygen Vacancies in Vfb/Vt Stability of pFET Metals on HfO2," 2005 Symposium on VLSI Technology of Techical Papers, authorized licensed use limited to: KnowledgeGate from IBM Market Insights, downloaded on Apr. 23, 2010 from IEEE Xplore, pp. 230-231.

K. Shiraishi et al., "Physics in Fermi Level Pinning at the PolySi/Hf-based High-k Oxide Interface," 2004 Symposium on VLSI Technology Digest of Technical Papers, copyright 2004 IEEE, authorized licensed use limited to: KnowledgeGate from IBM Market Insights. Downloaded on Apr. 23, 2010 from IEEE Xplore, pp. 108-109.

X. Wang et al., "Effects of Water Vapor Anneal on MIS Devices Made of Nitrided Gate Dielectrics," 1996 Symposium on VLSI Technology Digest of Techical Papers, copyright 1996 IEEE, authorized licensed use limited to: KnowledgeGate from IBM Market Insights. Downloaded on Apr. 23, 2010 from IEEE Xplore, pp. 226-227.

\* cited by examiner

MULTIPLE THRESHOLD VOLTAGES IN FIELD EFFECT TRANSISTOR DEVICES

FIELD OF INVENTION

The present invention relates to semiconductor field effect transistors (FET), and particularly to threshold voltages in FET devices.

DESCRIPTION OF RELATED ART

A FinFET, Tri-Gate, and nanowire devices typically include a non-planar multiple gate transistor device. The device includes a conducting channel disposed on a silicon fin, nanowire, or similar linear structure.

Complimentary metal oxide semiconductor (CMOS) devices exhibit a threshold voltage (Vt). A voltage applied to the gate of an n-type device (gate voltage) that equals or exceeds the threshold voltage induces a low resistance conductive path between the source and drain regions of the device. While a gate voltage that is below the threshold voltage results in little or no conductive path between the source and drain regions.

In electronic circuits with CMOS devices, devices with different threshold voltages are used to realize circuit function. Previous methods of fabricating multiple devices with different threshold voltages included implanting different types of substrate dopants for FET devices that result in different threshold voltages.

BRIEF SUMMARY

In one aspect of the present invention, a method for fabricating a field effect transistor device includes forming a first conducting channel and a second conducting channel on a substrate, forming a first gate stack on the first conducting channel to partially define a first device, forming second gate stack on the second conducting channel to partially define a second device, implanting ions to form a source region and a drain region connected to the first conducting channel and the second conducting channel, forming a masking layer over second device, a portion of the source region, a portion of the drain region, and a portion of the substrate, performing a first annealing process operative to change a threshold voltage of the first device, removing a portion of the masking layer to expose the second device, and performing a second annealing process operative to change the threshold voltage of the first device and a threshold voltage of the second device.

In another aspect of the present invention, a field effect transistor device includes a first conductive channel disposed on a substrate, a second conductive channel disposed on the substrate, a first gate stack formed on the first conductive channel, the first gate stack including a metallic layer having a first oxygen content, a second gate stack a formed on the second conductive channel, the second gate stack including a metallic layer having a second oxygen, an ion doped source region connected to the first conductive channel and the second conductive channel, an ion doped drain region connected to the first conductive channel and the second conductive channel.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-7 illustrate an exemplary method for fabricating an exemplary embodiment of a FET device, in which:

FIGS. 8-10 illustrates an alternate exemplary method for fabricating an alternate exemplary embodiment FET device, in which:

DETAILED DESCRIPTION

Figure 1:
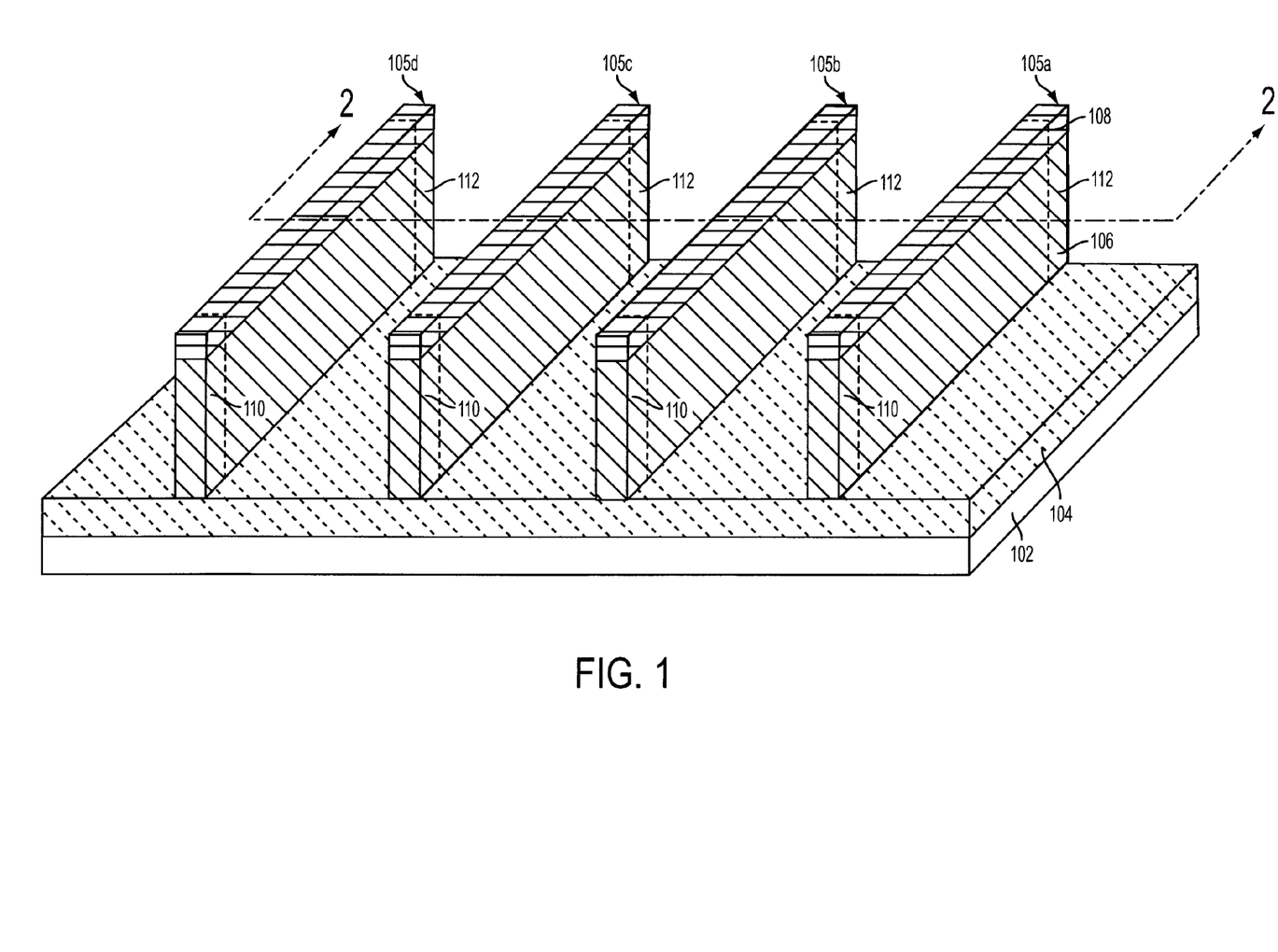
FIG. 1 illustrates a perspective view of an exemplary substrate and conducting channels.

FIGS. 1-7 illustrate an exemplary method for fabricating a FET device having a variety of different threshold voltages (Vt). In this regard, FIG. 1 illustrates a perspective view of a substrate 102 that may include, for example, silicon. A buried oxide (BOX) layer 104 is disposed on the substrate 102. A plurality of conducting channels 105a, 105b, 105c, and 105d are arranged on the BOX layer 104. The conducting channels 105 include a layer of silicon 106 formed on the BOX layer 104, and a layer of silicon nitride 108 formed on the layer of silicon 106. The layer of silicon 106 may also include SiN. The conducting channels may be formed by, for example, forming a layer of silicon on the BOX layer 104 and forming a layer of silicon nitride on the silicon layer. A lithographic patterning and etching process may be used to remove portions of the silicon and silicon nitride layers to form the conducting channels 105. Following the patterning of the conducting channels 105 n-type dopants (e.g., phosphorus, arsenic, or antimony) or p-type dopants (e.g., boron or aluminum) may be implanted in portions of the conducting channels 105 to form a source region 110 and a drain region 112 connected to the conducting channels 105 of the device. Alternatively, the devices may be doped following the formation of the gate stacks described below.

Though the illustrated embodiment describes methods for forming a FinFET device (using conducting channels 105), alternate embodiments may use similar methods in forming a nanowire FET device. FIGS.

Figure 2:
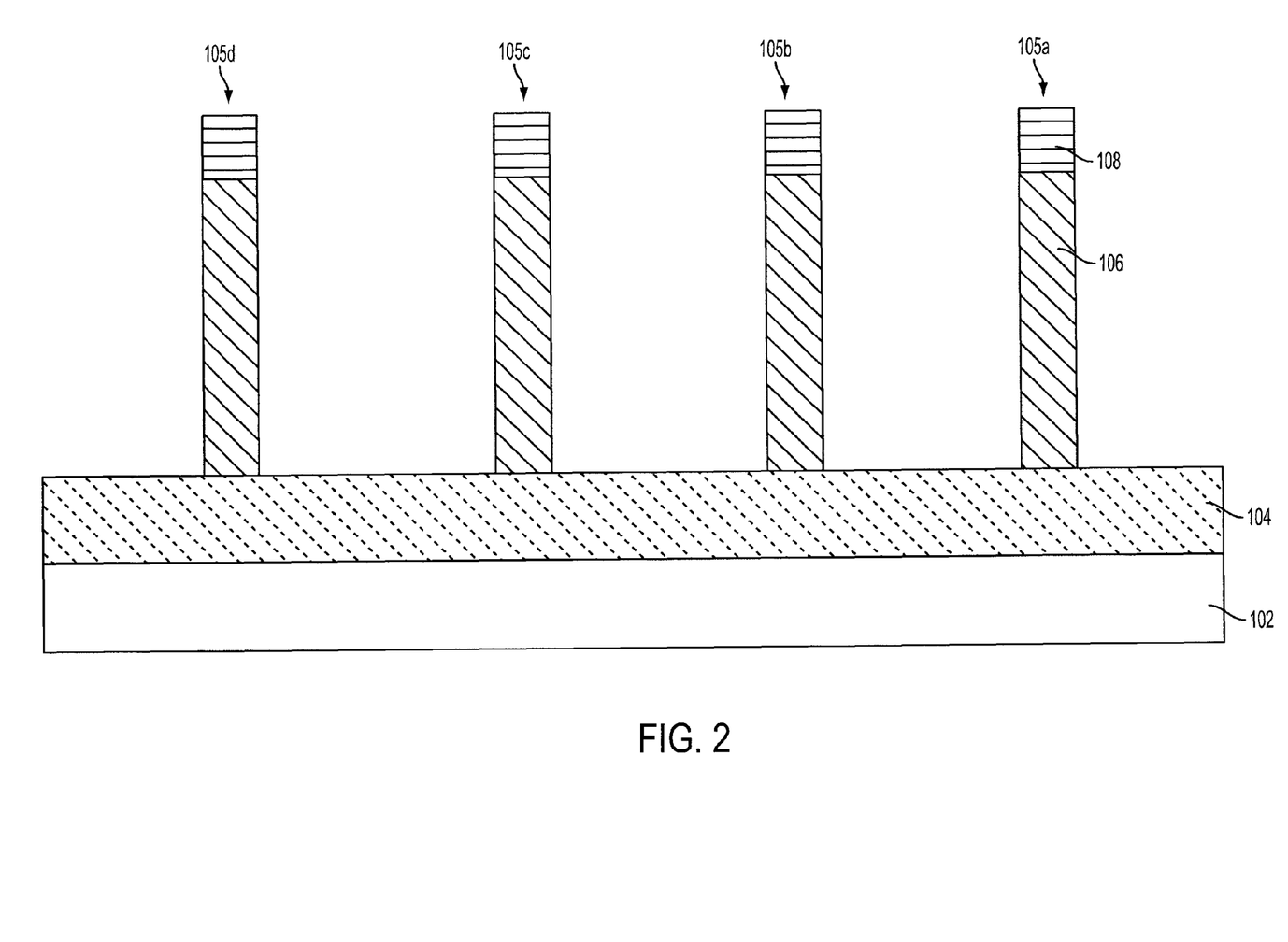
FIG. 2 illustrates side views along the line 2-2 of FIG. 1.

FIG. 2 illustrates a side cut-away view of the FET device along the line 2-2 of FIG. 1.

Figure 3:
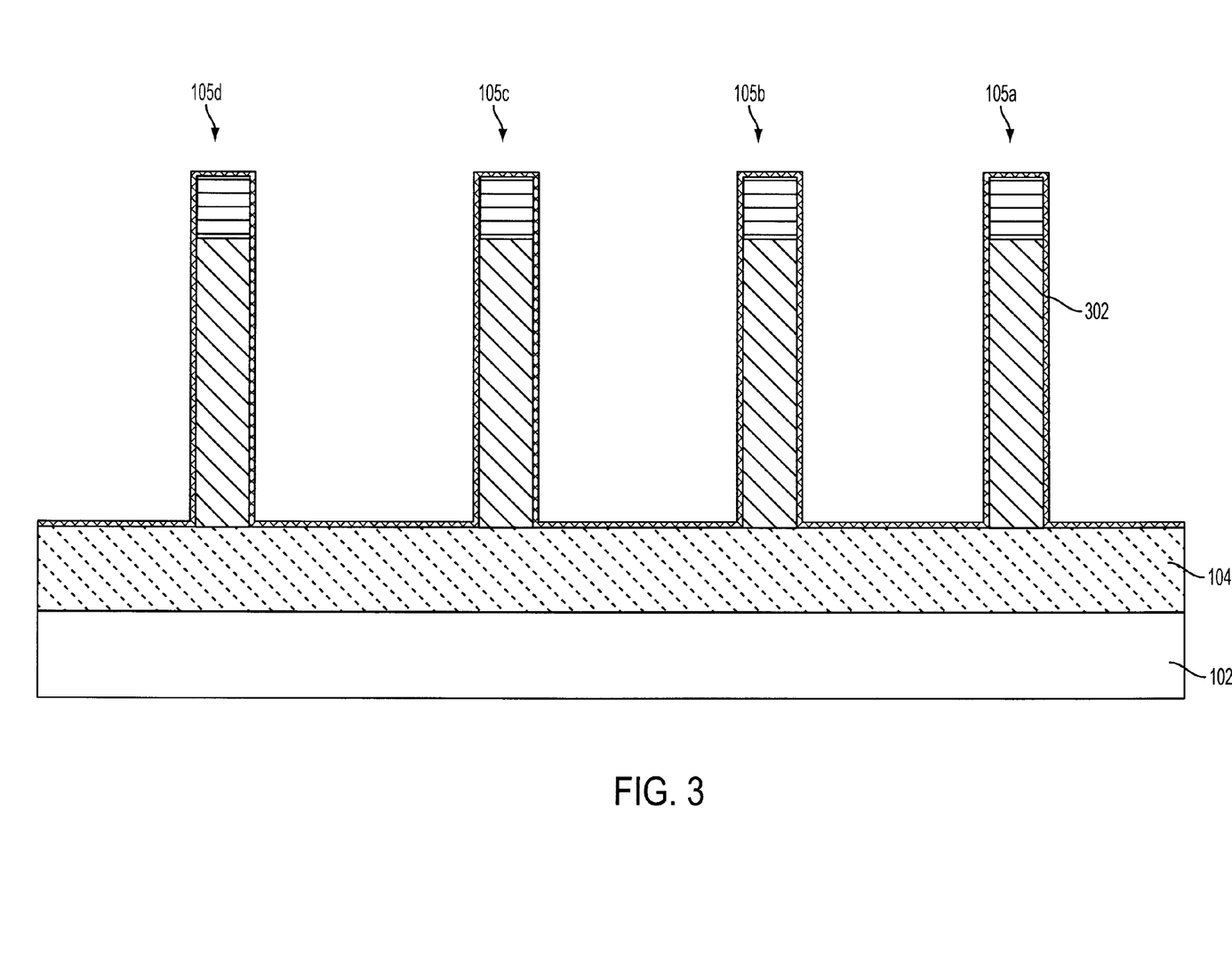
FIG. 3 illustrates the formation of a layer.

Referring to FIG. 3, a layer 302 is formed over portions of the conducting channels 105a, 105b, 105c, and 105d and the BOX layer 104. The layer 302 includes, for example, a high-K material or SiON. The layer 302 may be formed by, for example, a chemical vapor deposition (CVD) or a plasma-enhanced chemical vapor deposition (PECVD) process.

Figure 4:
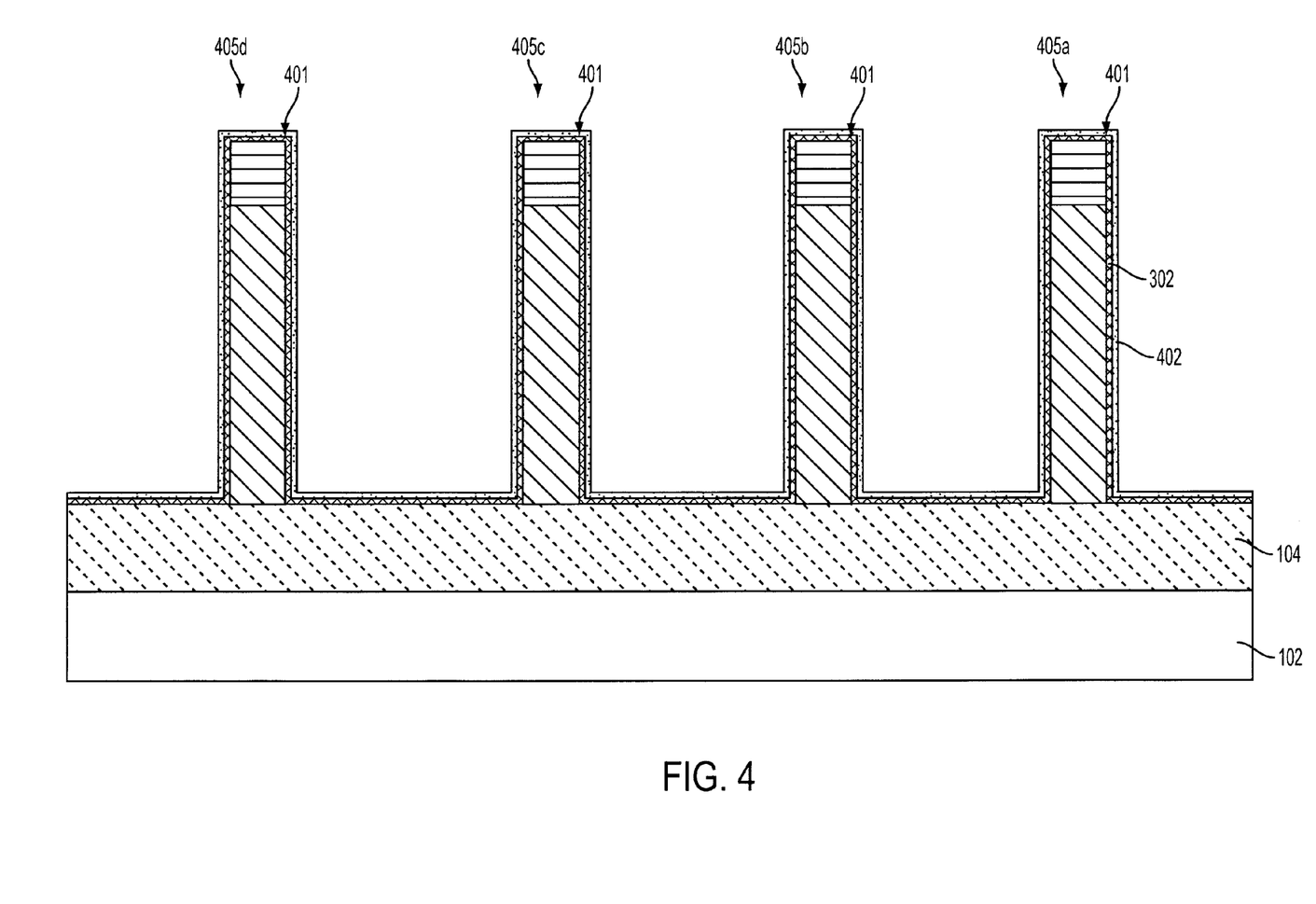
FIG. 4 illustrates the formation of a layer.

FIG. 4 illustrates the formation of a layer 402 over the layer 302. The layer 402 may include, for example, a metallic gate material such as, for example, tungsten, titanium, cobalt, or nickel that may be formed by a CVD or PECVD process. The layers 302 and 402 form the gate stacks 401 of FET devices 405a, 405b, 405c, and 405d.

It may be desirable to fabricate FET devices having different threshold voltages. For example, the FET 405a may have a different threshold voltage than the FETs 405b, 405c, and 405d.

Figure 5:
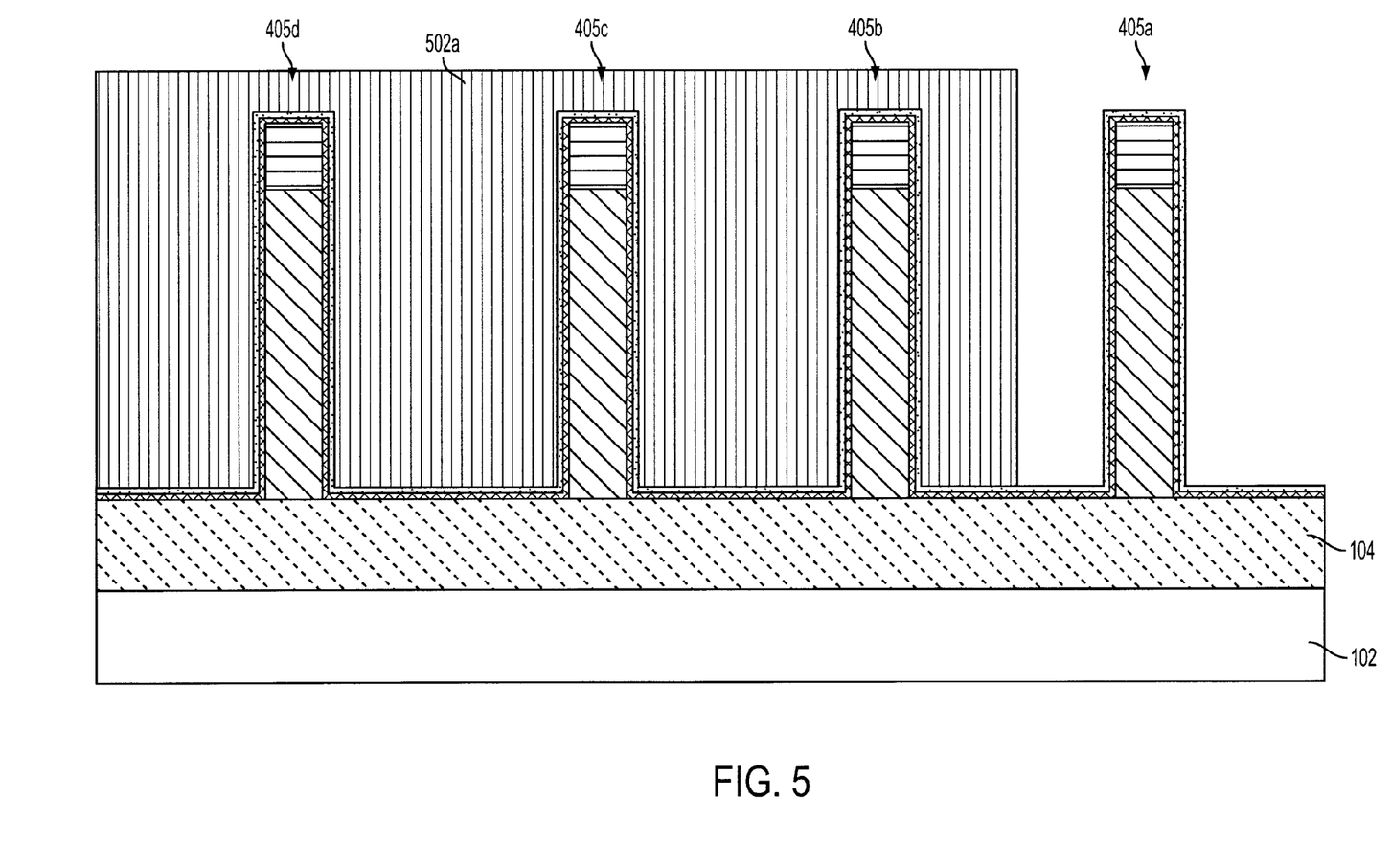
FIG. 5 illustrates the formation of a masking layer.

In this regard, referring to FIG. 5, a masking layer 502a is deposited over the FETs 405b, 405c, and 405d, leaving the FET 405a exposed. The masking layer 502a may include, for example, a lithographically patterned layer of silicon nitride material. In the illustrated embodiment, the FET that will be formed with the FET 405a remains exposed, however alternate embodiments may cover or expose any number of FET similar to 405. Following the formation of the masking layer 502a, the device is annealed to activate the implanted dopants. The annealing process changes the threshold voltage (Vt) of the exposed FET 405a. The change in threshold voltage ($\Delta Vt$) will depend on the parameters used such as annealing temperature, time, ambient fluid, and dopant type will determine the $\Delta Vt$ for the annealed device. For example, in the illustrated embodiment the annealing process includes heating the device to approximately 550° C. in ambient water vapor or oxygen. The annealing process may be performed, by example, at temperatures ranging from 350° C. to 800° C.; a partial pressure of oxygen or water vapor of between 1 Torr to 100 Torr; and a process time ranging from 30 seconds to 300 seconds. The annealing process results in the introduction of oxygen into the metal gate stack causing a reduction of oxygen vacancy in the stack. The introduction of oxygen in the annealing process results in a $\Delta Vt$ of the FET 405a of approximately +50 mV (for a nFET device) and approximately –50 mV (for a pFET) device.

Figure 6:
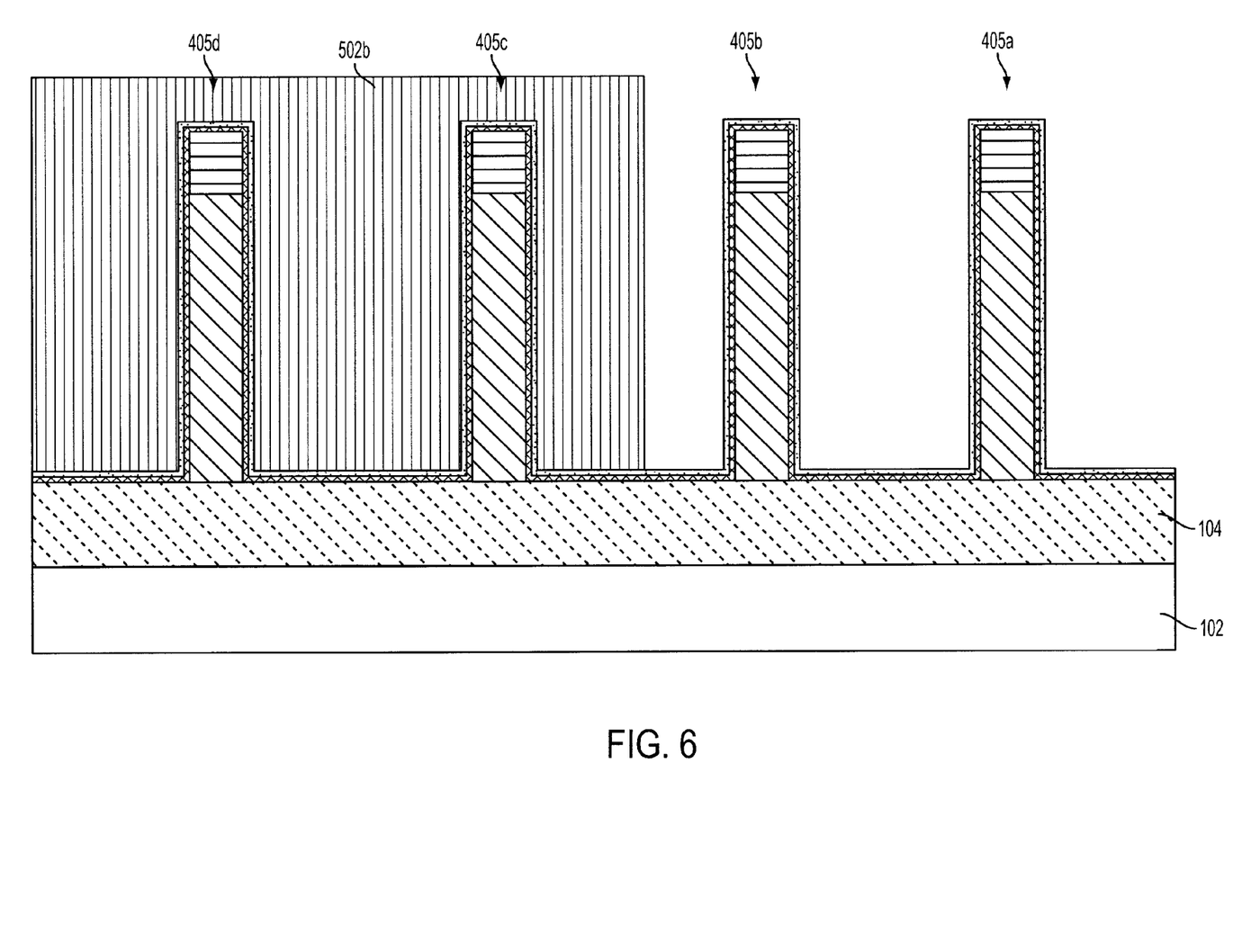
FIG. 6 illustrates the removal of portions of the masking layer.

FIG. 6 illustrates the resultant structure following the patterning and removal of portions of the masking layer 502a (of FIG. 5) to expose the FET 405b resulting in the masking layer 502b. Following the exposure of the FET 405b the device may be annealed in a similar manner as described above; introducing additional oxygen into the exposed gate stacks. In the illustrated exemplary embodiment, the second annealing process uses similar parameters as discussed above resulting in a similar change in Vt for the FETs 405a and 405b. The resultant Vt for the devices may be described as $Vt=x+\Delta Vt$ where x is a baseline threshold voltage of the device and n is the number of similar annealing processes performed on an exposed FET 405. Thus, the Vt of the FET 405a may be defined as $Vt_a=x+(\Delta Vt*2)$ where n=2; while the Vt of the FET 405b may be defined as $Vt_b=x+\Delta Vt$ where n=1.

Though the illustrated embodiment uses similar annealing parameters for each annealing process, resulting in a similar $\Delta Vt$, different annealing parameters may be used for one or more of the annealing processes resulting in a different $\Delta Vt$. For example, if the FET 405a is exposed to a first annealing process resulting in a $\Delta Vt_1$ and the FETs 504a and 405b are exposed to a second annealing process resulting in a $\Delta Vt_2$, the Vt of the FET 405a may be defined as $Vt_a=x+\Delta Vt_1+\Delta Vt_2$ while the Vt of the FET 405b may be defined as $Vt_b=x+\Delta Vt_2$.

Figure 7:
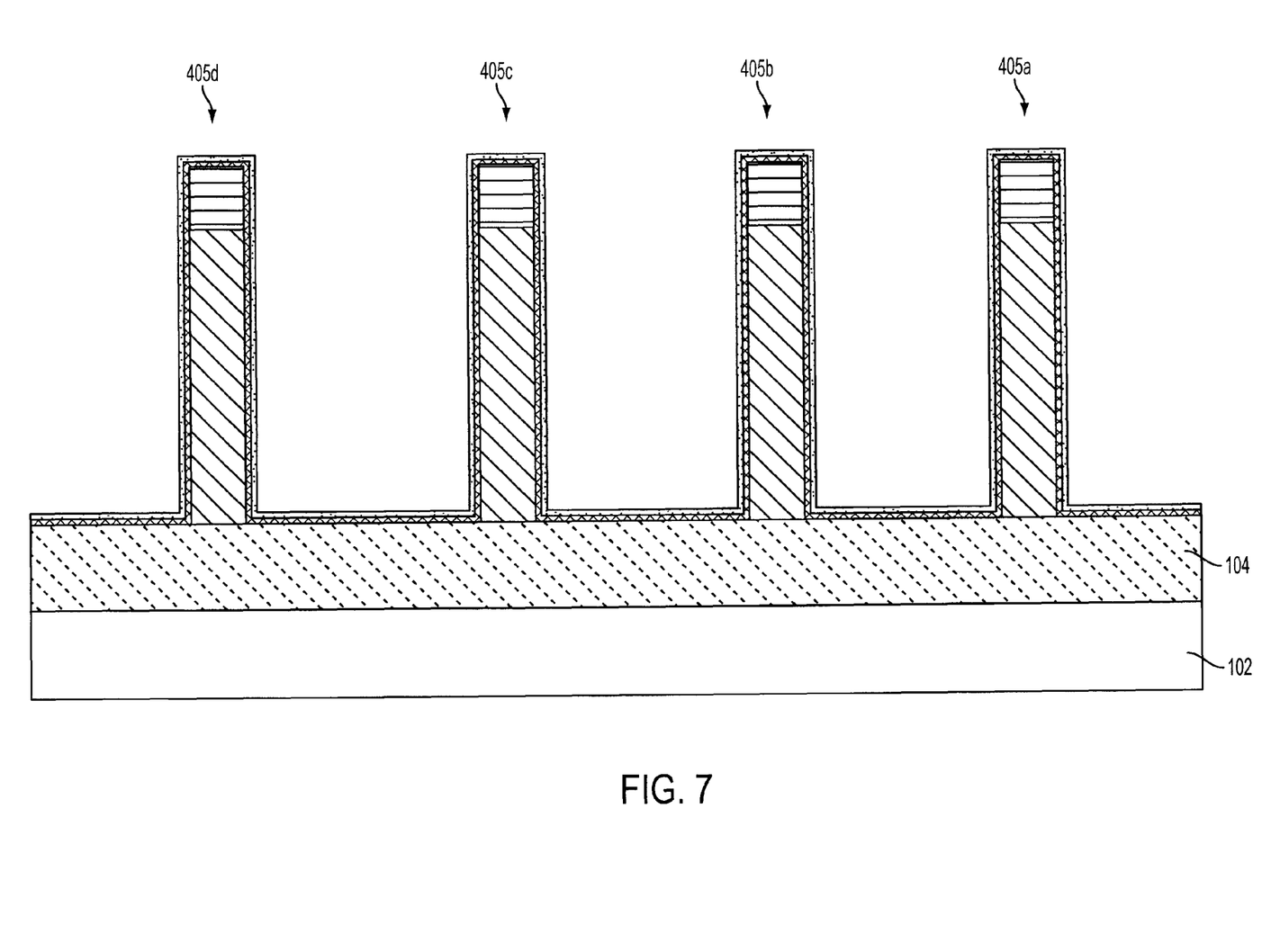
FIG. 7 illustrates the removal of the masking layer.

FIG. 7 illustrates the resultant structure following the removal of the masking layer 502b (of FIG. 6) to expose the FETs 405c and 405d. Following the removal of the masking layer, another annealing process may be performed on the devices. For example, following the annealing of the exposed FETs 405c and 405d, the resultant voltage thresholds for the devices (where the $\Delta Vt$ is similar for each of the annealing processes) may be defined as $Vt_a=x+(\Delta Vt*3)$ where n=3; $Vt_b=x+(\Delta Vt*2)$ where n=2, and $Vt_c=Vt_d=x+\Delta Vt$ where n=1.

Figure 8:
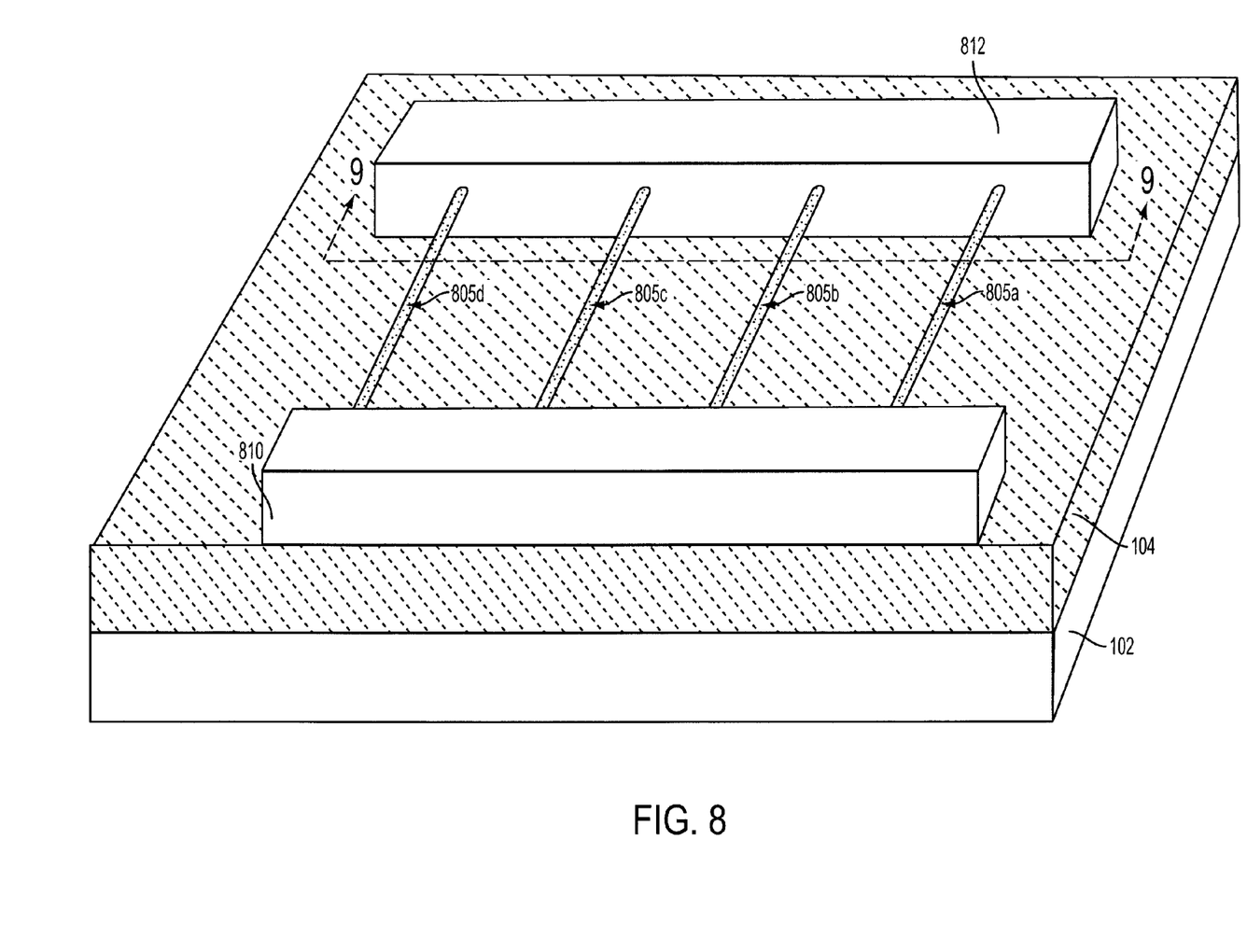
FIG. 8 illustrates a perspective view of a buried oxide layer formed on a substrate.
Figure 9:
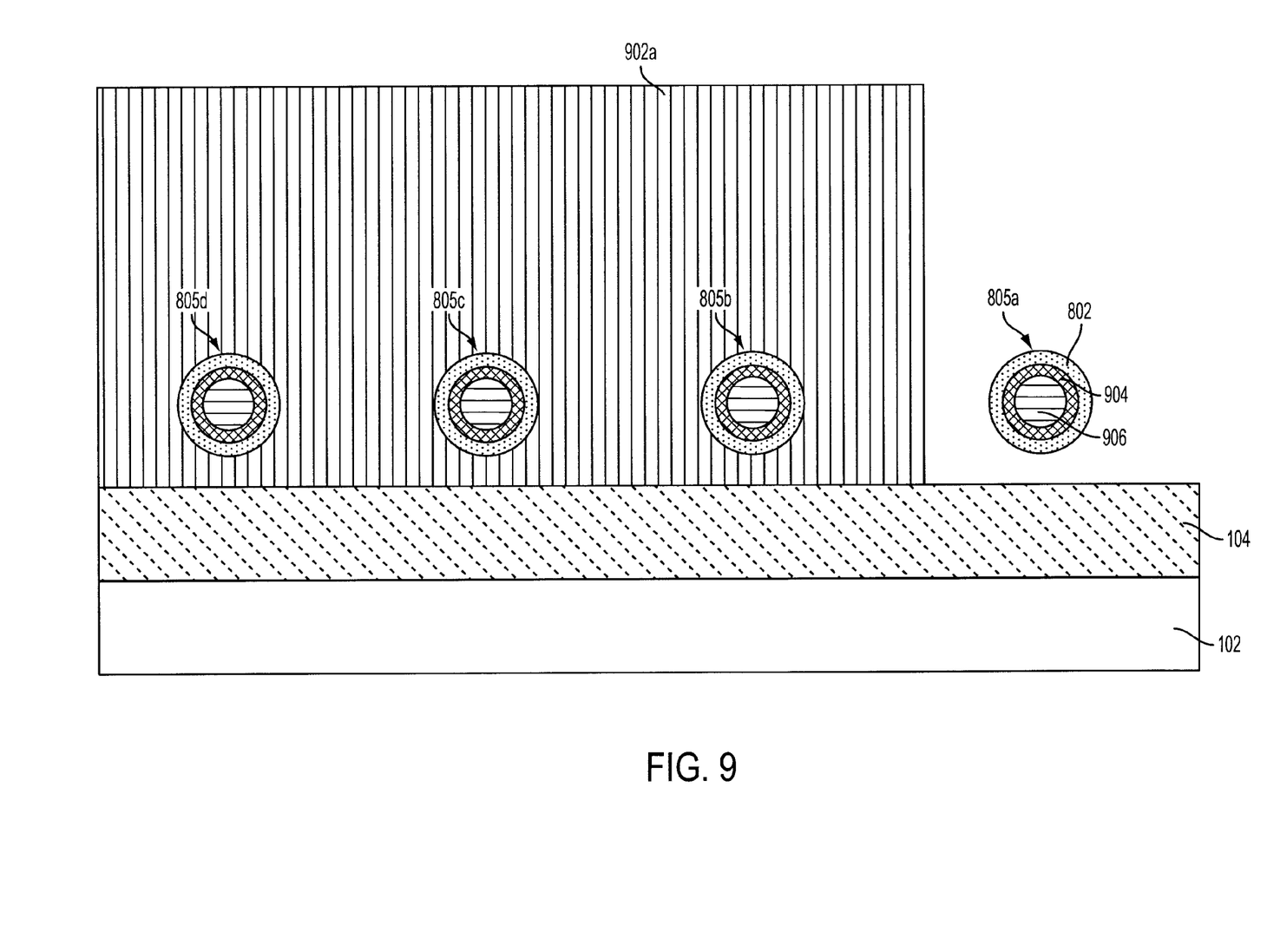
FIG. 9 illustrates a side view along the line 9-9 of FIG. 8 including the formation of a masking layer.
Figure 10:
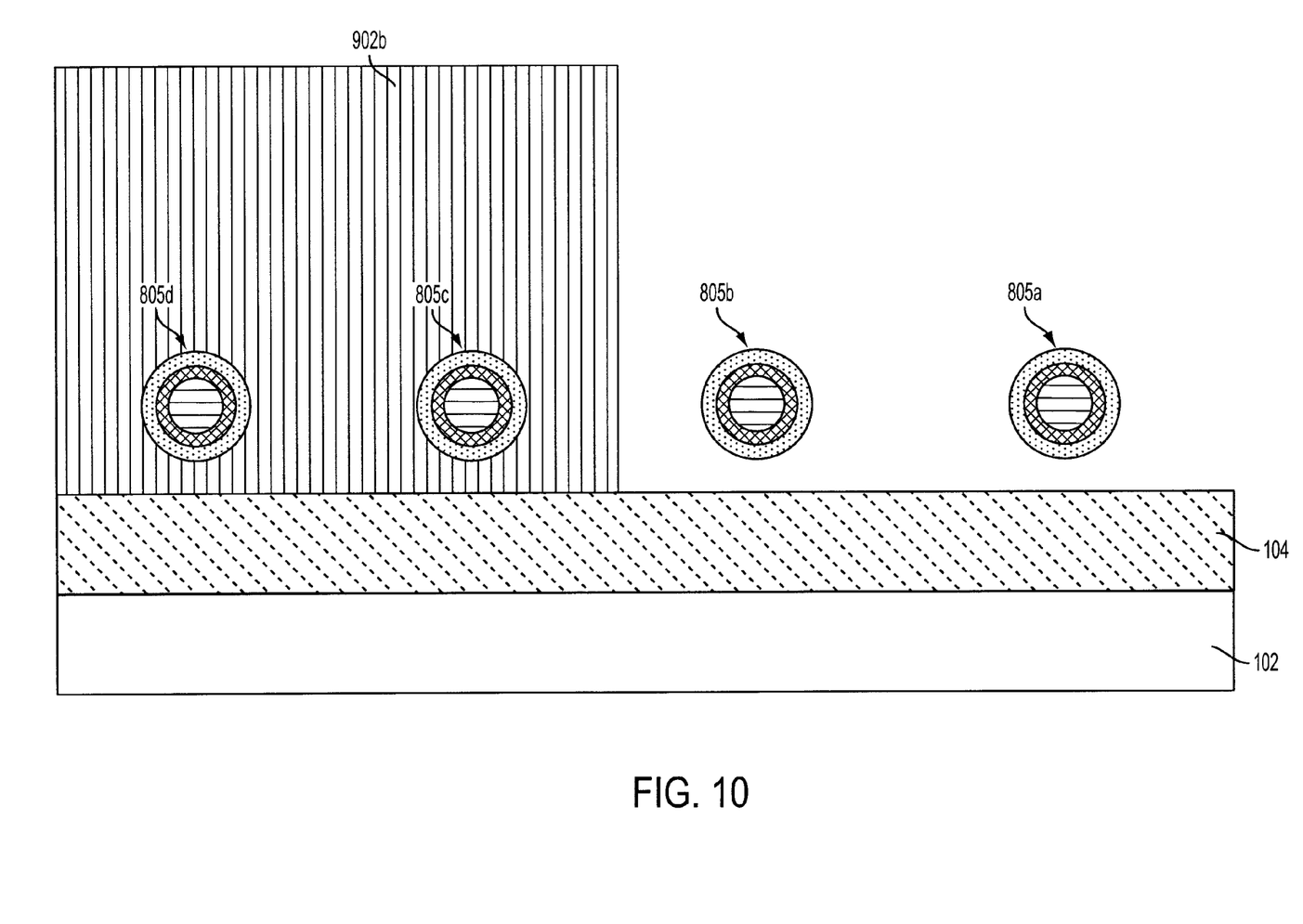
FIG. 10 illustrates the removal of portions of the masking layer.

Though the illustrated exemplary methods above describe forming a FinFET device (using conducting channels 105), alternate embodiments may use similar methods in forming other multi-gate devices such as, for example, a nanowire FET device. FIGS. 8-10 illustrate an alternate exemplary method for forming FET devices with different threshold voltages in a nanowire FET device.

FIG. 8 illustrates a perspective view of a BOX layer 104 formed on a silicon substrate 102. A plurality of nanowire FET devices 805a, 805b, 805c, and 805d are formed on the BOX layer 104. The FET devices 805a-d include a nanowire 906 conducting channel (shown in FIG. 9 below) that may include, for example, a silicon material formed by a patterning and etching process. A gate stack is formed over the nanowire 906 that includes a high-K layer 904 (shown in FIG. 9 below) that is formed on the nanowire 906, and a metallic gate layer 802 is formed on the high-K layer 904. The devices may be doped with ions in a similar manner as described above to form a source region 810 and a drain region 812 of the device. Once the nanowire FET devices 805a-d are formed, similar masking and annealing methods as described above may be performed to vary the threshold voltage in the device.

In this regard, FIG. 9 illustrates a side cut-away view of the device along the line 9-9 (of FIG. 8). In the illustrated embodiment the masking layer 902a is formed over the FET devices 805b, 805c, and 805d. An annealing process similar to the process described above is performed to increase or decrease the threshold voltage of the FET device 805a.

FIG. 10 illustrates the removal of a portion of the masking layer 902a resulting in the masking layer 902b that exposes the FET device 805b. Following the exposure of the FET device 805b, a second annealing process may be performed in a similar manner as described above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a field effect transistor device, the method including:
   forming a first conducting channel and a second conducting channel on a substrate;
   forming a first gate stack on the first conducting channel to partially define a first device;
   forming second gate stack on the second conducting channel to partially define a second device;
   implanting ions to form a source region and a drain region connected to the first conducting channel and the second conducting channel;
   forming a masking layer over second device, a portion of the source region, a portion of the drain region, and a portion of the substrate;
   performing a first annealing process operative to change a threshold voltage of the first device;
   removing a portion of the masking layer to expose the second device; and
   performing a second annealing process operative to change the threshold voltage of the first device and a threshold voltage of the second device.

2. The method of claim 1, wherein the implanted ions include p-type ions.

3. The method of claim 2, wherein the first annealing process is operative to increase an amount of oxygen in the first gate stack such that the threshold voltage of the first device is decreased.

4. The method of claim 3, wherein the second annealing process is operative to further increase an amount of oxygen in the first gate stack such that the threshold voltage of the first device is further decreased, and to increase an amount of oxygen in the second gate stack such that a threshold voltage of the second device is decreased.

5. The method of claim 1, wherein the implanted ions include n-type ions.

6. The method of claim 5, wherein the first annealing process is operative to increase an amount of oxygen in the first gate stack such that the threshold voltage of the first device is increased.

7. The method of claim 6, wherein the second annealing process is operative to further increase an amount of oxygen in the first gate stack such that the threshold voltage of the first device is further increased, and to increase an amount of oxygen in the second gate stack such that a threshold voltage of the second device is increased.

8. The method of claim 1, wherein the first annealing process includes heating the device at 350° C. to 800° C. in ambient water vapor such that oxygen is introduced into a metallic layer of the first gate stack.

9. The method of claim 1, wherein the first annealing process includes heating the device at 350° C. to 800° C. in ambient oxygen at a partial pressure of 1 Torr to 100 Torr such that oxygen is introduced into a metallic layer of the first gate stack.

10. The method of claim 1, wherein the second annealing process includes heating the device at approximately 550° C. in ambient water vapor at a partial pressure of 1 Torr to 100 Torr such that oxygen is introduced into a metallic layer of the first gate stack.

11. The method of claim 1, wherein the second annealing process includes heating the device at approximately 550° C. in ambient oxygen such that oxygen is introduced into a metallic layer of the first gate stack.

12. The method of claim 1, wherein the forming the first conducting channel and the second conducting channel includes:
   forming a layer of silicon on the substrate;
   forming a layer of silicon nitride on the layer of silicon; and
   patterning and etching the layer of silicon and the layer of silicon nitride to form the first conducting channel and the second conducting channel.

13. The method of claim 1, wherein the forming the first conducting channel and the second conducting channel includes:
   forming a layer of silicon on the substrate; and
   patterning and etching the layer of silicon to form a first nanowire defining the first conducting channel and a second nanowire defining the second conducting channel.

14. The method of claim 1, wherein the forming the first gate stack includes:
   forming a high-K layer on the conducting channel; and
   forming a metallic layer on the high-K layer.

15. The method of claim 1, wherein the first device is a Fin field effect transistor device.

16. The method of claim 1, wherein the first device is a nanowire field effect transistor device.

* * * * *